(12) United States Patent
Joshi et al.

(10) Patent No.: US 11,726,236 B2
(45) Date of Patent: Aug. 15, 2023

(54) GRADED PORE STRUCTURE WITHOUT PHASE MASK

(71) Applicant: Toyota Motor Engineering & Manufacturing North America, Inc., Plano, TX (US)

(72) Inventors: Shailesh N. Joshi, Ann Arbor, MI (US); Gaurav Singhal, Champaign, IL (US); Paul Vannest Braun, Champaign, IL (US); Danny J. Lohan, Ann Arbor, MI (US); Kai-Wei Lan, Champaign, IL (US)

(73) Assignees: Toyota Motor Engineering & Manufacturing North America, Inc., Plano, TX (US); The Board of Trustees of The University of Illinois, Urbana, IL (US)

( * ) Notice: Subject to any disclaimer, the term of this patent is extended or adjusted under 35 U.S.C. 154(b) by 0 days.

(21) Appl. No.: 17/395,029

(22) Filed: Aug. 5, 2021

(65) Prior Publication Data
US 2023/0044343 A1     Feb. 9, 2023

(51) Int. Cl.
| | | |
|---|---|---|
| *G02B 1/00* | (2006.01) | |
| *G02B 6/12* | (2006.01) | |
| *G02B 6/122* | (2006.01) | |
| *B82Y 20/00* | (2011.01) | |
| *G02B 6/136* | (2006.01) | |

(52) U.S. Cl.
CPC ......... *G02B 1/005* (2013.01); *G02B 6/12002* (2013.01); *G02B 6/1225* (2013.01); *G02B 6/136* (2013.01); *B82Y 20/00* (2013.01)

(58) Field of Classification Search
CPC .. G02B 1/005; G02B 6/12002; G02B 6/1225; G02B 6/136; B82Y 20/00
See application file for complete search history.

(56) References Cited

U.S. PATENT DOCUMENTS 7,704,644 B2 * 4/2010 Schneider ............... G03H 1/10
430/1

OTHER PUBLICATIONS

Lin, X. et al., "Complex polymer brush gradients based on nanolithography and surface-initiated polymerization," Chem. Soc Rev., 2012, 41, pp. 3584-3593 (10 pages).

\* cited by examiner

*Primary Examiner* — John Bedtelyon
(74) *Attorney, Agent, or Firm* — Christopher G. Darrow; Darrow Mustafa PC

(57) ABSTRACT

A method to form a three-dimensional photonic crystal template with a gradient structure involves irradiating a photoresist composition of a thickness of at least 15 μm from at least four laser beams to yield a periodic patterned with a percolating matrix of mass in constructive volumes of a cured photoresist composition and destructive volumes of voids free of condensed matter where the proportion of constructive volume displays a gradient from the irradiated surface to the substrate after development. For a given light intensity, photoinitiator concentration in the photoresist composition, and a given thickness, by irradiating for a relatively short period, a three-dimensional photonic crystal template displaying a gradient having greater constructive volume proximal the air interface forms and a relatively long irradiation period results in a gradient having greater constructive volume proximal the substrate.

17 Claims, 5 Drawing Sheets

GRADED PORE STRUCTURE WITHOUT PHASE MASK

TECHNICAL FIELD

The present disclosure generally relates to a porous structure where a size of pores by holographic lithography of a photoresist derived layer displays a gradient along a depth dimension of the layer.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

The formation of a three-dimensional photonic crystal provides a structure where, due to a favorable geometry of voids and mass of high refractive index, photonic band gaps can be prepared where light does not propagate in any direction. These crystals have been developed with the goal of forming enabling devices for optical switching, sensors, filters, wave guides, or any other structure that is functional due to a universally connected structure with percolating pores throughout. These materials have features with dimensions of the nanometer and micrometer scales. A method to produce such materials is by holographic lithography or multibeam interference lithography. Multibeam interference lithography does not provide a flexibility and resolution that is exhibited by other techniques, such as electron or ion beam lithography (EBL or IBL), however, superior patterning speed and pattern coherence are observed at scales larger than about 10 nanometers.

In multibeam interference lithography, multiple laser beams are needed to generate an interference pattern in a photoresist that upon development generate a three-dimensional pattern of voids and mass. Three-dimensional structures have been fabricated by a light activated polymerization of a negative photoresist. The polymerization occurs during a post-patterning baking process, as initiation occurs without significant propagation after photoinitiation. The typical structure that results is a periodic matrix of percolating pores throughout a solid resin, where the pattern of volumes that experience destructive interference define the geometry of the voids in the structure.

For many applications, a gradient of pores is advantageous across the thickness of a layer. For example, where a heat transfer involves heating or cooling a surface by a fluid, a gradient structure is desirable to promote fluid flow to and/or from a surface to be heated or cooled.

SUMMARY

This section provides a general summary of the disclosure and is not a comprehensive disclosure of its full scope or all features of embodiments.

In various aspects, the present teachings provide three-dimensional photonic crystal templates that are three-dimensional structures with average features of about 0.1 to 10 microns. The structure is prepared by a multibeam interference lithography process within a negative photoresist. Post-development of the exposed photoresist, a periodic pattern of solid constructive volumes and void destructive volumes results where the proportion of the volume that is void of condensed mass varies as a gradient along the depth perpendicular to a support for the photoresist of the graded three-dimensional photonic crystal template. When the photoresist composition layer on the substrate is sufficiently thick and when the dose is small, a greater proportion of the three-dimensional photonic crystal template near the surface proximal to the laser source is solid matter and a large proportion of the three-dimensional photonic crystal template proximal to the substrate is void of condensed matter. Though not to be bound by a mechanism, this is consistent when significant gradient of dose is created at the top and bottom interface of the photoresist, this gradient is a function of light power, exposure time, and resist thickness, where photoinitiator undergoes photolysis to an active species at a highest degree closer to the light source and to a lesser degree proximal to the substrate when the exposure time is small, although other effects during processing could account for these features. Longer exposure times provide greater light dosages. The proportions of mass and voids reverses with the voids decreasing in volume while traversing the three-dimensional photonic crystal template from the photolysis surface to the substrate proximal surface. The degree and manner to which this phenomenon is observed depends on the thickness of the layer and the concentration of the photoinitiator relative to the dosing protocol.

To prepare the graded porosity three-dimensional photonic crystal template, laser beams of non-equal intensity and appropriate orientations are used to allow the periodic structures to be formed on reflective as well as a non-reflective substrate. Advantages of a reflective substrate include those where the substrate material has sufficient electrical conductivity to use the three-dimensional photonic crystal template for electrodeposition or other electrolysis processes that can generate salt or metal decorated surfaces or infuse the voids of the structure with metals or other materials. The three-dimensional photonic crystal template can be subsequently modified to generate active devices that are supported by or formed within the voids of the periodic template. The devices from the templates can be used for supported catalysis, heat transfer materials, or any other use where a fluid percolating through a high surface area matrix is desirable. Electrodeposition of metals can be performed using the three-dimensional photonic crystal template. The present method allows control of the proportion of constructive volume features by changes in the dosage of light provided by the laser beams, particularly using various irradiation times with fixed laser beam intensities.

In another aspects, the present teachings provide a method to perform multibeam interference lithography with at least four laser beams where a negative photoresist is patterned on a conductive substrate without anomalies due to undesired mass in the void destructive volumes. In one embodiment, a central beam can be delivered perpendicularly to the substrate and a multiplicity of equally spaced beams relative to the central beam and each other can be disposed at an angle of less than about 40° to the central beam. By having a central beam of greater intensity than the other beams and by using a controlled light dose with a reflective substrate, a gradient of voids can be generated along the depth of the three-dimensional photonic crystal template.

Further areas of applicability and various methods of enhancing the above coupling technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

Figure 1:
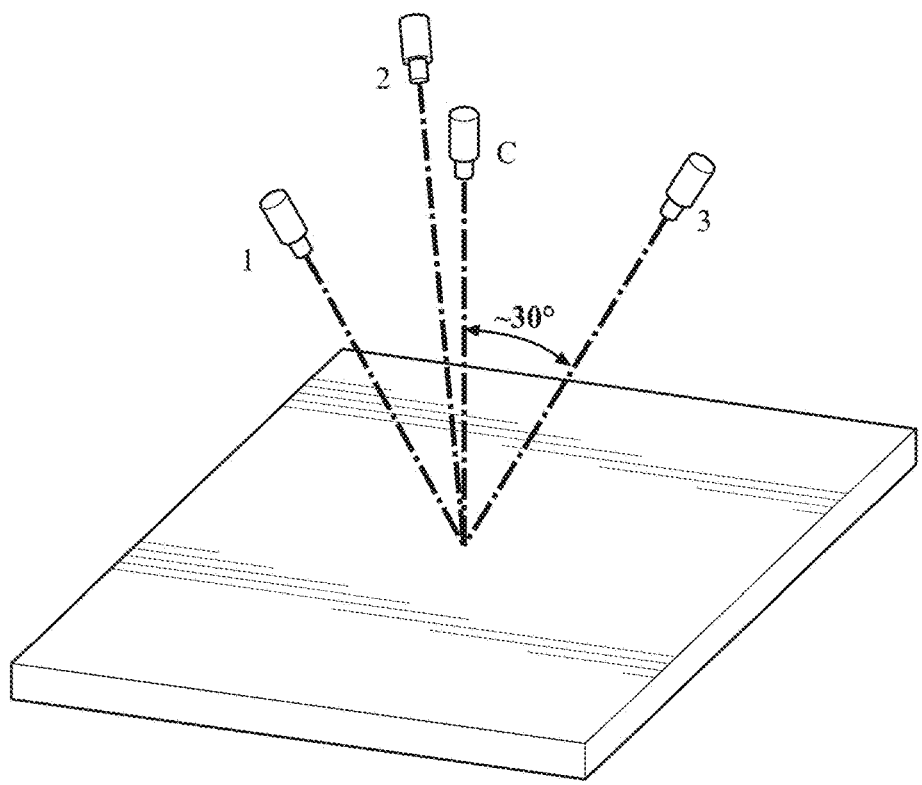
FIG. 1 shows a drawing of the orientation of four laser beams, C, 1, 2, and 3 for the controlling step in a process for the generation of three-dimensional photonic crystal templates according to one aspect of the present technology.

It should be noted that the figures set forth herein are intended to exemplify the general characteristics of the methods, algorithms, and devices among those of the present technology, for the purpose of the description of certain aspects. These figures may not precisely reflect the characteristics of any given aspect and are not necessarily intended to define or limit specific embodiments within the scope of this technology. Further, certain aspects may incorporate features from a combination of figures.

DETAILED DESCRIPTION

The present teachings provide a method for preparing a three-dimensional photonic crystal template on a substrate. For purposes of embodiments, the substrate may be any material, and may be a reflective or a non-reflective substrate. A reflective substrate may be conductive, and, for purposes of some embodiments, the substrate is conductive when the substrate material displays a conductivity greater than deionized water. In various embodiments, the three-dimensional photonic crystal template has a periodic structure without features due to an unintended degree of cross-linking initiated by reflected light rays in destructive volumes, which are regions with destructive interference during lithography and intended to be removed from constructive volumes upon dissolving a photoresist composition from the destructive volumes during a development step of the template. A reflective substrate is employed with no insulating antireflective coating situated between the substrate and the patterned cured photoresist to minimize reflectance. For many applications, a sufficient conductivity of the substrate is desired of the three-dimensional photonic crystal template. The three-dimensional photonic crystal template is suitable for preparing periodic porous structures for use in supported catalysts, metallic heat transfer devices, other metallic devices, or other non-metallic devices, where metallic devices can be formed by electroplating. The remaining mass of the cured photoresist features in the constructive volume varies in a gradient along the depth of the template formed and this gradient is controlled by the light dose that is employed relative to a photoinitiator content for generation of an initiating species in any given development recipe and the thickness of the photoresist deposited.

The presently disclosed three-dimensional photonic crystal templates are generated by an interference lithographic method using four or more laser beams where the beams are of unequal intensity. The periodicity of the three-dimensional photonic crystal template is controlled by the orientation of the laser beams employed to carry out the lithographic process. In one embodiment, although differing orientations and alignments of beams are possible, one beam is situated perpendicular to the substrate supporting the patternable photoresist and three beams are situated about 120° apart and directed at an acute angle, generally, but not necessarily, less than about 40° to the central beam and intersecting with the central beam at an air or inert gas-photoresist interface. The central perpendicular beam can be of greater intensity, for example, about four times the intensity, of the other three beams, individually or collectively. By using this geometry and a reflective substrate, the dose required for pattern formation can be achieved with a very short irradiation period, for example, less than about 0.3 seconds using a 5W laser. The laser interference provides a sufficient dose for patterned initiator generation throughout the photoresist in constructive volumes with this relatively short irradiation, but the reflected light is of insufficient intensity to generate an insoluble mass in the destructive regions as the irradiation geometry and the light dose is set to avoid photoinitiation to a degree required for gelation in those volumes where voids are to be formed after development of the photoresist composition. By fixing the laser intensity, modification of the process requires manipulation of only the exposure time. In this manner, a three-dimensional photonic crystal template can be constructed where the proportion of constructive volume to destructive volumes and the gradient of voids can be controlled by varying only the irradiation time used when a thickness and photoinitiator concentration is established.

As detailed herein, the method for making periodic photonic crystal templates uses a fixed, though not equal, laser intensity for all beams. The fraction of the final three-dimensional photonic crystal templates that are void varies as a gradient along the depth of the template and the direction of the gradient is controllable by the irradiation period for a given laser power. In this manner, the smaller an irradiation time, the lesser quantity of an active species is generated and the greater the solid volume near the irradiated surface relative to the solid volume at the substrate for a fixed laser beams' intensity and using a fixed development procedure. In this manner, the manufacturing process can be readily altered by only the exposure time to bias the nature of the density gradient of the three-dimensional photonic crystal template. As the exposure period is controlled by effectively switching the light on and off, the void portion of the template can be altered as desired from template to template, even during a production run of multiple templates.

The three-dimensional photonic crystal templates of the present disclosure can be used as a template for processes that require a sufficiently conductive substrate, such as a silicon substrate, to allow electrodeposition or other processes requiring using the substrate as an electrode. In this manner, a relatively large area template with nanometer to micrometer features can be formed with a short burst of laser light. The three-dimensional photonic crystal template can be of various negative photoresists, when the initiation of polymerization can be generated photolytically by the laser wavelengths employed. In general, but not necessarily, the polymerization is a living or controlled diffusion polymerization, such as a photo-cationic, photo-anionic, or a photo-generated reversibly stabilized radical polymerization. For example, the negative photoresist can be SU-8, a multi-epoxy monomer that is polymerized via a cationic photoinitiator activated by the light projected on the surface with an interference pattern of initiating cations formed within the glassy photoresist. By appropriate choice of the angle of the laser beams to the substrate, the reflected light from the reflective substrate can be complementary to the incident light for generating a desirable three-dimensional photonic crystal template.

Figure 2:
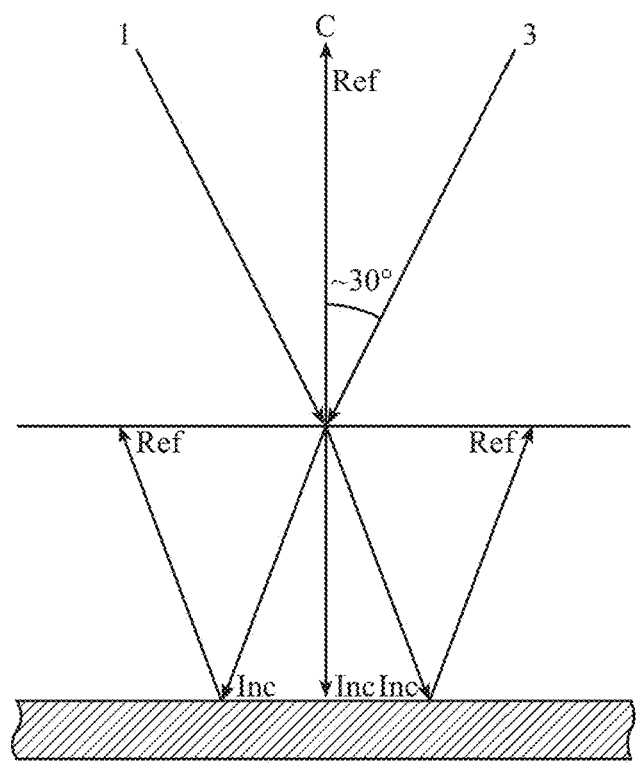
FIG. 2 is a drawing indicating a projection of laser beams C and 1 and 3 of FIG. 1 where the colinear incident and reflectance of C contrasts with the reflectance of the incident beams 1 and 3 according to one aspect of the present technology.

In one aspect, the laser beams may be oriented in the manner illustrated in FIG. 1, where the central beam (C) is perpendicular to the substrate surface with three other beams (1, 2, and 3) oriented with an angle of about 30° to beam C, and where beams 1, 2, and 3 are oriented at about 120° to each other. The intensity of beam C may be about 3.7 times the intensity of beams 1, 2, and 3, which are of the same intensity. The beams are all in the same phase, being split from a single source beam. As shown in FIG. 2, the path of beam C is such that the incident beam and reflected beam from the reflective substrate are co-linear and provide a nearly doubling of the intensity of the light along beam C's orientation and does not promote a significant reflection defect activation. The reflection of incident beams 1, 2, and 3 are of significantly lower intensity, allowing the defect photo-initiated active species to be of insufficient concentration to develop a cross-linked structure at a sufficient rate that forms a defect during a subsequent development step. This orientation and differing beam intensities allows for a full development of the intended interference pattern that defines the three-dimensional photonic crystal template by using a short beam dosing period.

In one aspect, the method does not require any modification of an established development protocol for initiation, polymerization, crosslinking, and developing to form the cured photoresist resin. A traditional process for forming and developing a photoresist is outlined in the flow chart provided in FIG. 3, beginning with the formation of an SU-8/photo acid generator solution. The solution is spin-coated and deposited as a layer on a substrate, with the solvent subsequently evaporated. The layer is exposed laser beams to generate an interference pattern of acid initiator. The method proceeds to a baking step to polymerize an SU-8 structure in the interference pattern. In various aspects, the pattern is developed in PGME to remove free SU-8 monomer. For example, the pattern is subsequently developed by dissolving unpolymerized volumes of the structure. This may be followed with supercritical drying steps to ultimately yield the photonic crystal.

In the development of the polymer, which further effects the dissolving of the unpolymerized or insufficiently polymerized regions, diffusion rates of the generated active species and propagation rates of the photoresist polymer must be considered. As the degrees of initiation and propagation affect the diffusing species structures, controlling the three-dimensional photonic crystal template structure becomes a complicated problem where a functional window is easily missed. Modification of the post irradiation process does not readily lend to achieving an easily modified route to a desired specific structures where small difference in time, temperature, and concentration all can promote a loss of structural control. The control of the dosing rate has little error associated with its implementation as the control is exclusively of the amount of initiator generated, particularly with photoinitiators with a high quantum yield, such as, but not limited to, iron-arene salts, such as, cyclopentadienyl (fluorene) iron (III) hexafluorophosphate as a cationic initiator. Photoinitiators that do not act as thermal initiators at temperatures employed for deposition on the substrate or baking during development are advantageous. Other iron-are salts that can be used include Irgacure 261, [Cp-Fe-Naph]$PF_6$, CFC, and CFA. Other photoinitiators include diaryliodonium salts and triarylsulfonium salts. The anion coupled to the cation of these photoinitiators can be, but are not limited to, $PF_6$, $SbF_6$, $BF_4$, triflate, and tosylate. A photosensitizer can be included with the photoinitiator. Useful photosensitizers include DIEF, RBAX, TIHF, Acridine Orange, and Erythrosin B. In this manner, the method is implemented by fine control of only one variable, the photonic dose, and does not require a consideration of the complicated multiple processes that occur during a development bake and void forming dissolving process.

Figure 3:
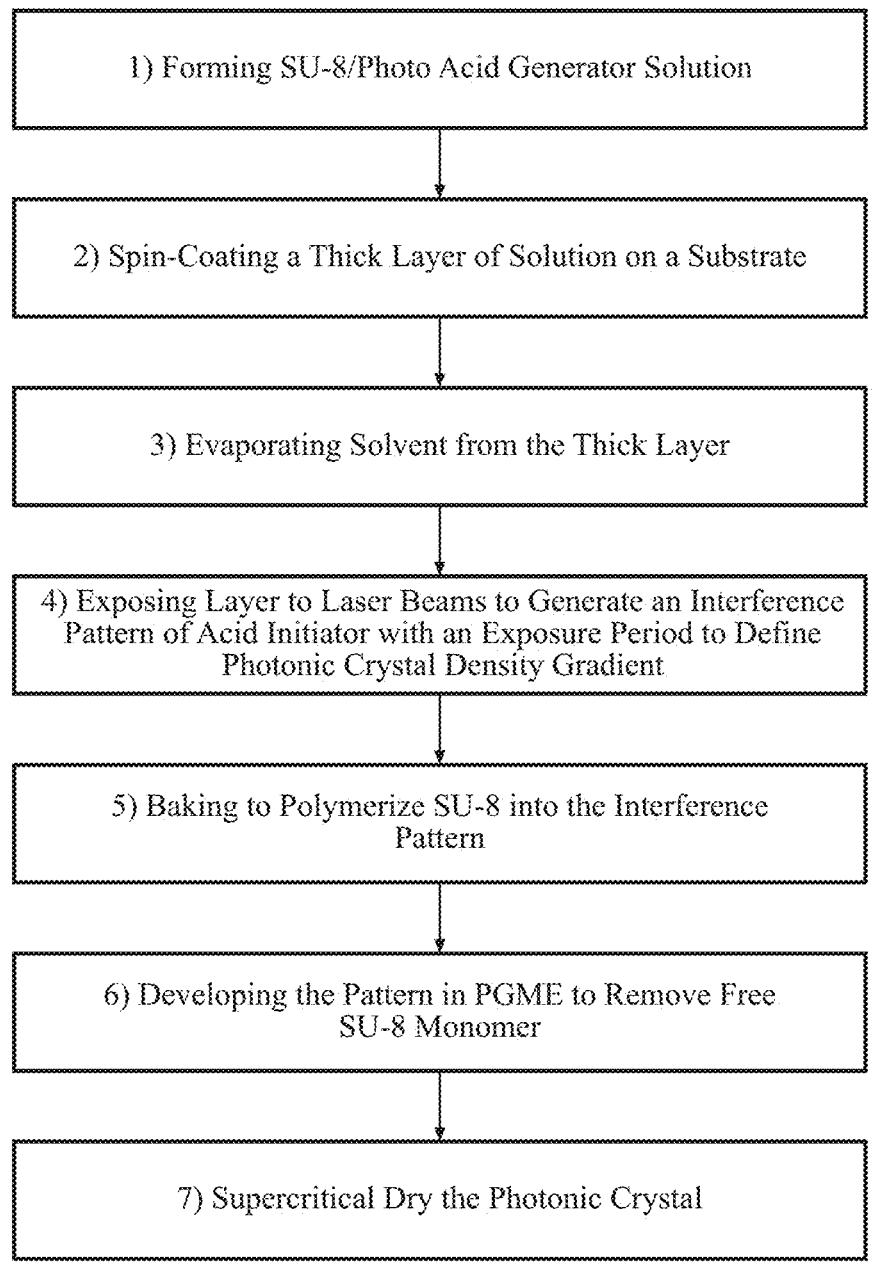
FIG. 3 is a flow chart of a production method to form a patterned photoresist according to one aspect of the present technology.

Portions of the process of FIG. 3 are graphically illustrated in FIGS. 4A-4D. FIGS. 4A-4D illustrate structure determining steps, and the outcome after exposing a homogeneously dispersed photoinitiator in a polyfunctional monomer to form a pattern of photo-released acid that, upon baking, forms a pattern of solid cross-linked polymer by acid initiation, and yields the photonic crystal by dissolution of unreacted monomer and photoinitiator.

Figure 4A:
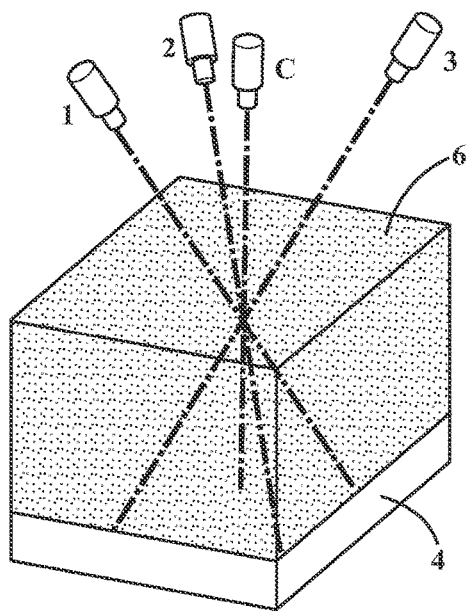
FIG. 4A is an example of the irradiation of a structure by laser beams, the structure including a reflective substrate with an SU-8 layer deposited thereon.
Figure 4B:
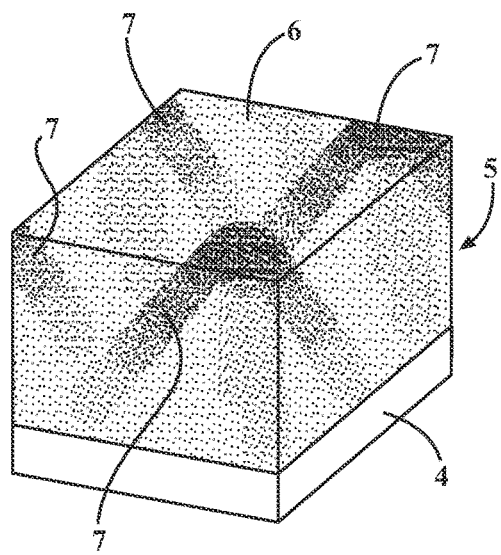
FIG. 4B is an example of the structure after irradiation, showing an irradiation-formed pattern of photogenerated acid.

The exemplary structure of FIG. 4A includes a reflective substrate 4 with an SU-8 layer 5 deposited thereon. The SU-8 layer 5 includes a dispersed or dissolved photoinitiator 6 in order to provide a photo curable resin layer. Notably, FIGS. 4A-4D illustrate the formation of a portion of a layer of the photonic crystal along the z-axis, and it should be appreciated that this pattern may be displaced in the x-y plane, repeated in an overlapping manner, and displaced along the z-axis multiple times to form the entire photonic crystal, depending only upon the orientations of the laser beams and thickness of the photo curable resin layer. FIG. 4A begins the patterning process, and provides an exemplary illustration of the irradiation by laser beams 1, 2, 3, and C on the surface of the SU-8 layer 5. The relative thickness of deposited SU-8 layer 5 and substrate 4 in FIGS. 4A-4D are not intended to limit the thickness of either layer, or their relative thickness. As shown in FIG. 4B, the irradiation forms a pattern of photogenerated acid 7 generally being leveled by reaction with an epoxy group of the SU-8 as an initiated, but not propagating in the glassy SU-8. The pattern of photogenerated acid 7 shown is exemplary in nature, and may begin with a gradient-like pattern with areas of different intensity, since the formation of photogenerated acid 7 generally occurs at locations where there is constructive interference of the beams, and the beam orientation may vary.

Figure 4C:
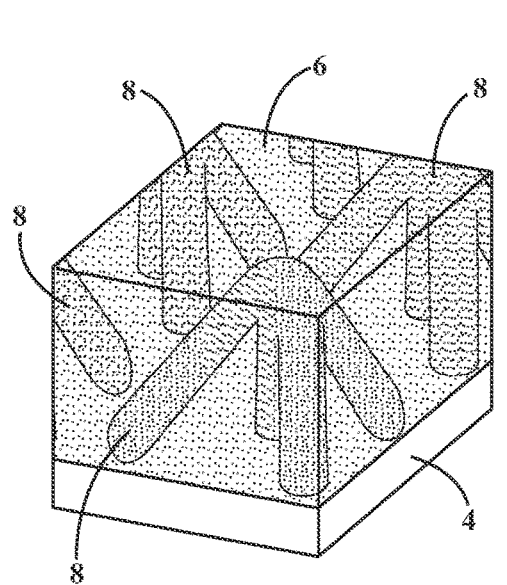
FIG. 4C is an example of the structure after baking, showing a volume of unreacted SU-8 monomer and photoinitiator remaining in a continuous periodic pattern contacting a complementary crosslinked polymer in a continuous periodic pattern.

The post irradiation processing is represented by the transition of FIG. 4B to FIG. 4C, and includes baking the exposed substrate and photoresist composition to a temperature of less than about 90° C. but more than about 75° C., such as about 85° C. Because the photogenerated initiator photolytically decomposes to, for example, a Lewis acid 7 that adds to the polymerizable functionality of the photoresist, for example, an epoxy functionality of SU-8, polymerization of the multifunctional monomer and crosslinking occur to form a solid mass of crosslinked polymer 8 filled constructive volumes of the templates. Temperatures greater than the desired temperature result in polymerization beyond the constructive volume, and temperatures less than the desired temperature do not permit significant polymerization in the glassy film. The time for post baking depends on the temperature employed, where higher temperatures require less time. After the baking and post baking, a volume of unreacted SU-8 monomer 5 and photoinitiator 6 remains in a continuous periodic pattern contacting a complementary a crosslinked polymer 8 continuous periodic pattern, as shown in FIG. 4C.

Figure 4D:
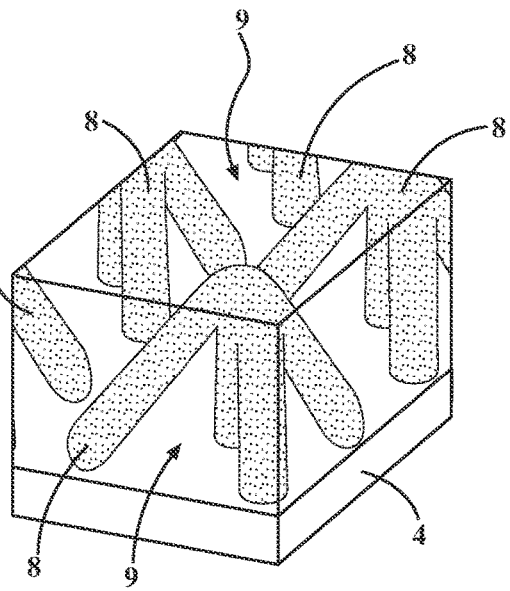
FIG. 4D is an example of the structure after dissolving of the monomer and non-crosslinked polymer, showing a pattern of connected voids residing within the three-dimensional photonic crystal template of cross-linked polymer from SU-8.

After baking, development continues with the dissolving of the monomer and non-crosslinked polymer in the destructive volumes that will generate the voids of the three-dimensional photonic crystal template. As shown in FIG. 4D, this results in a pattern of connected voids 9 residing within the three-dimensional photonic crystal template of cross-linked polymer 8 from SU-8. The dissolving of the non-crosslinked polymer in the destructive volumes will generate the voids of the three-dimensional photonic crystal template. As active centers remain in the cross-linked volumes, the temperature and diffusion of photoresist solution from the developing three-dimensional photonic crystal template are set for an optimal generation of the template. The solvent can be propylene glycol monomethyl ether acetate (PGMEA) or any other solvent such as acetone, cyclopentanone, and tetrahydrofuran. These solvents swell the crosslinked SU-8 resin and, for example, PGMEA can be desorbed to a large extent by placing the three-dimensional photonic crystal template in isopropanol.

To avoid structural collapse of the voids during a final drying of the three-dimensional photonic crystal template due to surface tension effects, drying can be carried out using supercritical CO2 where the liquid-vapor interface is beyond the critical point. The wet three-dimensional photonic crystal template is placed in liquid CO2 followed by heating past the critical point and releasing the pressure until ambient pressure and temperature is achieved. The resulting three-dimensional photonic crystal template is isolated with distinct constructive volumes of cross-linked photoresist polymer and destructive volumes void of condensed matter.

Modification of the irradiation profile during the formation of the three-dimensional photonic crystal template or by decorating the deposited photoresist surface with reflective or absorbing particles allows the formation of uniform, patterned or gradient periodic structures along any axis and bias the proportion of void volume in the template. This permits the formation of a metal matrix device that displays the negative of the template, where the void volumes result in the metal features and the resin features of the template generate the voids of the metal matrix upon degradation.

The resulting polymeric three-dimensional photonic crystal template, when situated on a substrate with sufficient conductivity, can be used to fill the voids with a metal or other material that can be deposited by an electrodeposition process. In this manner, the avoidance of defects is critical to assure that the necessary percolation of voids through the template allows the growth throughout the entire template formed from the photoresist layer. Removal of the template allows development of a metallic device, where the positive features of the device are formed in the voids in the template. The device has a gradient of features that match the gradient void structure of the template. Other non-metal devices can be prepared, such as a high surface area catalytic supports, where the three-dimensional photonic crystal template is a scaffold for the deposition of a catalyst layer on the template.

Figure 5A:
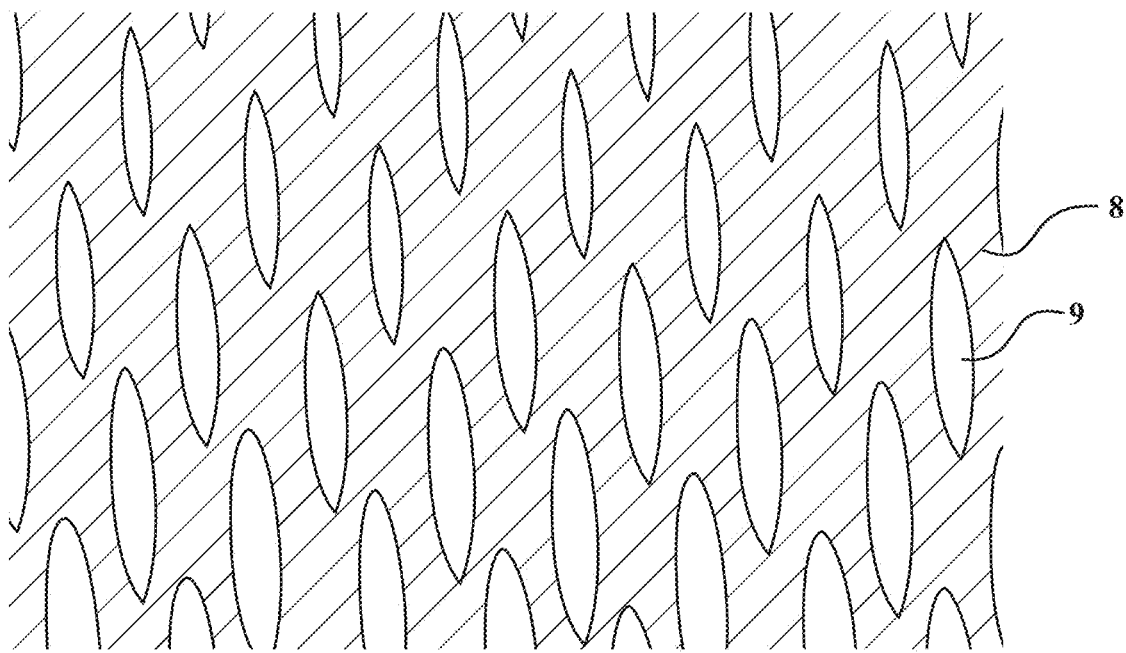
FIG. 5A shows a drawing that illustrates a SU-8 derived photonic crystal using four-beam interference lithography where a short exposure time yields a gradient with progressively greater pore volume proceeding from the air interface to the substrate surface, according to an embodiment.
Figure 5B:
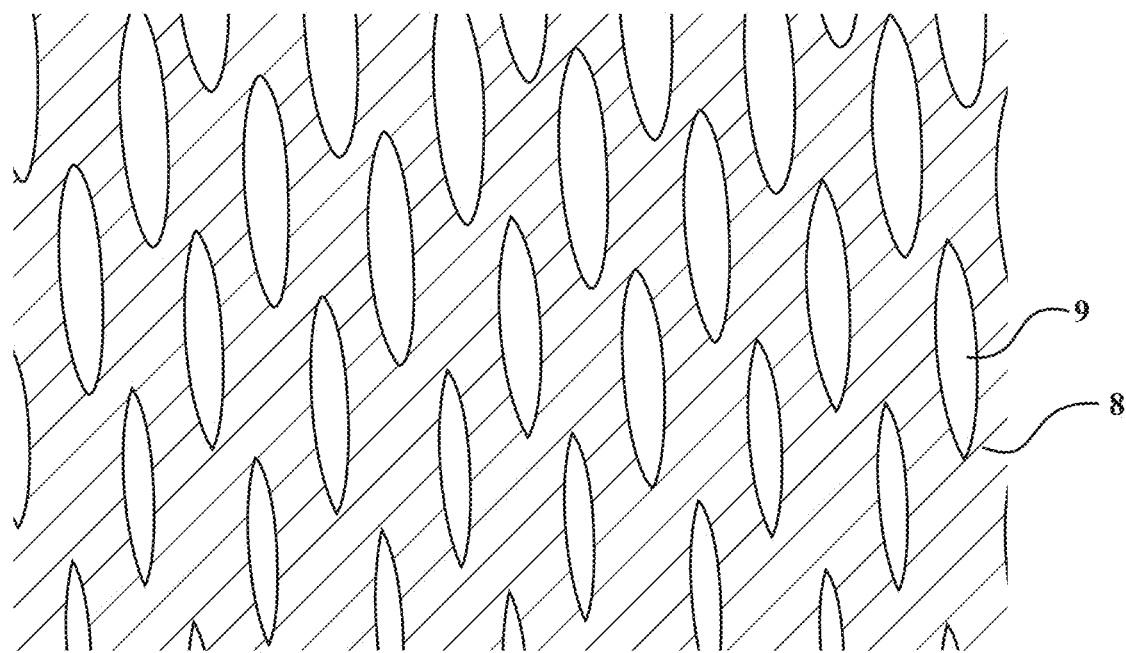
FIG. 5B shows a drawing that illustrates a SU-8 derived photonic crystal using four-beam interference lithography where a longer exposure time yields a gradient with progressively lesser pore volume proceeding from the air interface to the substrate surface.
Figure 6:
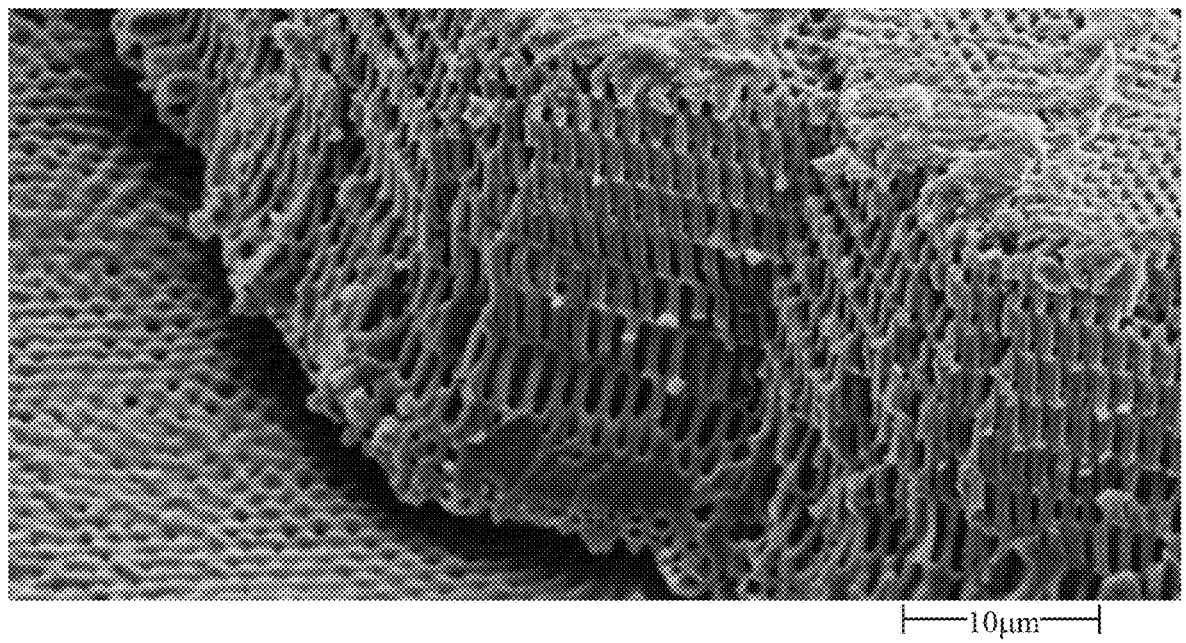
FIG. 6 shows a scanning electron micrograph of a SU-8 derived photonic crystal using four-beam interference lithography and a 0.3 second exposure time.
Figure 7:
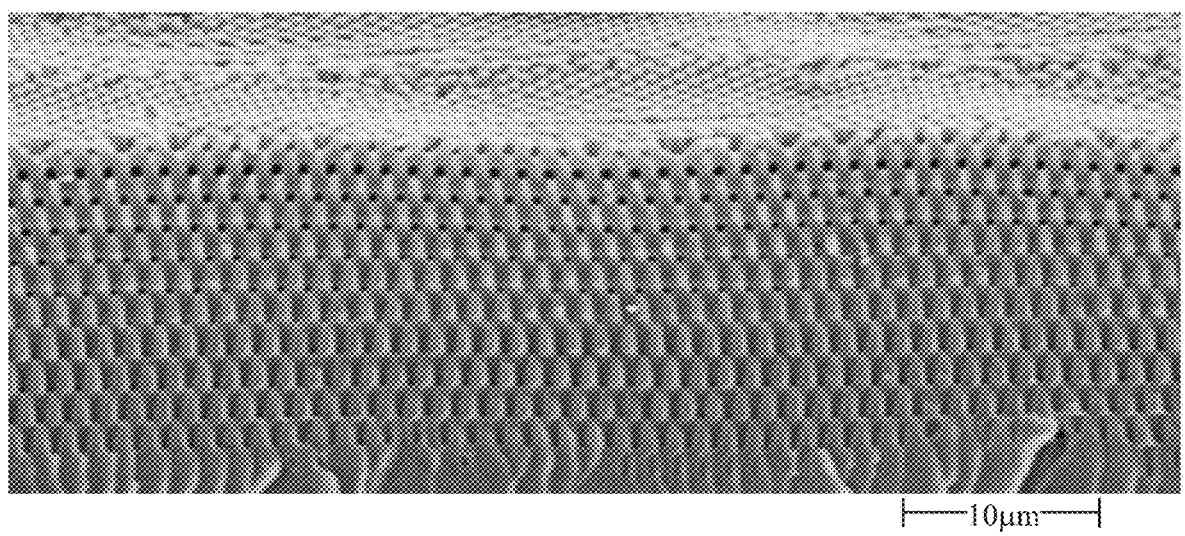
FIG. 7 shows a scanning electron micrograph of a SU-8 derived photonic crystal using four-beam interference lithography and a 0.5 second exposure time.

The use of a short irradiation times of less than about 1 second using, for example, a 5W laser can generate three-dimensional photonic crystal templates having a proportion of constructive volume that is directly proportional to the irradiation time with thin layers of photoresist compositions are used. The light dose determines the nature of the pattern, and herein, the recitation of a time must be considered in view of the laser power. Readily discernable gradients are not observed for three-dimensional photonic crystal templates formed from thin photoresist layers, for example those less than about 10 μm in thickness. With thick layers, a gradient of pores or void volumes results in a three-dimensional photonic crystal template having a percolating periodic matrix of voids is formed with a gradient displaying increasingly greater void volume while approaching the substrate, as shown in FIG. 5A, where under a short irradiation time of, for example 0.3 seconds. A thicker layer, when irradiated with a longer irradiation time, for example 0.5 seconds as shown in FIG. 5B, can generate a gradient with decreasing void volume while approaching the substrate is formed. This phenomenon is further illustrated in FIG. 6 and FIG. 7. As can be seen in FIG. 6 the solid mass fraction decreases with every depth of the periodic pattern, as is readily apparent from the first eight periods proceeding in the direction of the arrow. FIG. 7 shows the opposite phenomenon, where the solid mass fraction increases, as is apparent observing the first ten periods proceeding in the direction of the arrow.

Methods

A diode pump solid state laser, Verdi 5W (Coherent Inc.), a frequency doubled Nd:YVO$_4$ laser, was used at 532 nm for multi-beam interference lithograph. The Verdi 5W has a maximum power of 5.5 W and a beam diameter of 2.25 mm. It was used with the beam expanded to 9 mm using a spatial filter and sub-second exposure times. The optical platform employed a rigid table-top (Newport RS-4000) and pneumatic isolators (Newport 1-2000) for vibration dampening. The beam was split into four beams and arranged by the mirrors into an umbrella geometry, as shown in FIG. 1. The power ration of the beams was controlled by a polarizing cube beam splitter with a half waveplate situated before the splitter and additional half and quarter waveplates adjusting the side and central beams, respectively, to yield a 3.7 to 1 intensity ratio of the central and side beams, where the side beams are aligned at about a 30° angle to the central beam.

The photoresist composition of SU-8 octafunctional monomer with cyclopentadienyl(fluorene) iron (III) hexafluorophosphate photoinitiator was prepared in cyclopentanone and spin coated on a silicon wafer. Solvent evaporation from the photoresist composition was carried out on a hot plate to a temperature of about 65 ☐ C. for ten minutes and about 95 ☐ C. for twenty minutes. After cooling to room temperature, exposure was set using an electric shutter. Immediately after exposure, development was started with a bake at 85 ☐ C. for twenty minutes. After cooling to room temperature, propylene glycol monomethyl ether acetate (PGMEA) was used with gentle stirring to dissolve the destructive volumes and form the periodic structure of the three-dimensional photonic crystal template. Immersion into isopropanol results in the extraction of residual PGMEA from the cured SU-8 resin. Supercritical drying was carried out by immersion of the SU-8 resin on the Si wafer in liquid CO2 using ae critical point dryer (Samdri 790) at about 0° C. and slowly heated through the critical point followed by the slow release of pressure to ambient and cooling to ambient temperature to yield the three-dimensional photonic crystal template that displayed a gradient depending only on the period or irradiation and the thickness of the layer.

The preceding description is merely illustrative in nature and is in no way intended to limit the disclosure, its application, or uses. As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

As used herein, the term "about" includes exactly the term or number that it modifies and slight variations therefrom. "Slight variations therefrom" can include within 15 degrees/percent/units or less, within 14 degrees/percent/units or less, within 13 degrees/percent/units or less, within 12 degrees/percent/units or less, within 11 degrees/percent/units or less, within 10 degrees/percent/units or less, within 9 degrees/percent/units or less, within 8 degrees/percent/units or less, within 7 degrees/percent/units or less, within 6 degrees/percent/units or less, within 5 degrees/percent/units or less, within 4 degrees/percent/units or less, within 3 degrees/percent/units or less, within 2 degrees/percent/units or less, or within 1 degree/percent/unit or less. In some instances, "about" can include being within normal manufacturing tolerances.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should be also understood that the various method steps discussed herein do not have to be carried out in the same order as depicted, and not each method step is required in each aspect or embodiment.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

What is claimed is:

1. A three-dimensional photonic crystal template comprising:
    a periodic patterned cured photoresist composition on an electrically conductive reflective substrate, wherein a gradient of a constructive volume of the periodic patterned cured photoresist composition varies from an air interface to the electrically conductive reflective substrate such that the three-dimensional photonic crystal template has a porosity gradient.

2. The three-dimensional photonic crystal template according to claim 1, wherein the electrically conductive reflective substrate is a silicon wafer.

3. The three-dimensional photonic crystal template according to claim 1, wherein the periodic patterned cured photoresist composition comprises a polymerized photoresist with a residual photoinitiator.

4. The three-dimensional photonic crystal template according to claim 3, wherein the polymerized photoresist is polymerized SU-8 and the residual photoinitiator is cyclopentadienyl(fluorene) iron (III) hexafluorophosphate.

5. The three-dimensional photonic crystal template according to claim 1, wherein a thickness of the three-dimensional photonic crystal template is at least 15 μm.

6. The three-dimensional photonic crystal template according to claim 1, wherein the gradient of the constructive volume has a greater constructive volume proximal the air interface.

7. The three-dimensional photonic crystal template according to claim 1, wherein the gradient of the constructive volume has a greater constructive volume distal the air interface.

8. A three-dimensional photonic crystal template comprising:
    an electrically conductive reflective substrate; and
    a periodic patterned cured photoresist composition on the electrically conductive reflective substrate, the periodic patterned cured photoresist composition comprising a polymerized photoresist with a residual photoinitiator and a constructive volume with a gradient that varies from an air interface to the electrically conductive reflective substrate such the three-dimensional photonic crystal template has a porosity gradient.

9. The three-dimensional photonic crystal template according to claim 8, wherein the electrically conductive reflective substrate is a silicon wafer.

10. The three-dimensional photonic crystal template according to claim 8, wherein the polymerized photoresist is polymerized SU-8 and the residual photoinitiator is cyclopentadienyl(fluorene) iron (III) hexafluorophosphate.

11. The three-dimensional photonic crystal template according to claim 8, wherein a thickness of the three-dimensional photonic crystal template is at least 15 μm.

12. The three-dimensional photonic crystal template according to claim 8, wherein the gradient of the constructive volume has a greater constructive volume distal the air interface.

13. The three-dimensional photonic crystal template according to claim 8, wherein the gradient of the constructive volume has a greater constructive volume proximal the air interface.

14. A three-dimensional photonic crystal template comprising:
   an electrically conductive reflective substrate comprising a silicon wafer; and
   a periodic patterned cured photoresist composition on the electrically conductive reflective substrate, the periodic patterned cured photoresist composition comprising a polymerized SU-8 photoresist with a cyclopentadienyl (fluorene) iron (III) hexafluorophosphate residual photoinitiator and a constructive volume with a gradient that varies from an air interface to the electrically conductive reflective substrate such the three-dimensional photonic crystal template has a porosity gradient.

15. The three-dimensional photonic crystal template according to claim 14, wherein a thickness of the three-dimensional photonic crystal template is at least 15 μm.

16. The three-dimensional photonic crystal template according to claim 14, wherein the gradient of the constructive volume has a greater constructive volume distal the air interface.

17. The three-dimensional photonic crystal template according to claim 14, wherein the gradient of the constructive volume has a greater constructive volume proximal the air interface.

* * * * *